United States Patent [19]
Du

[11] Patent Number: 6,085,347
[45] Date of Patent: Jul. 4, 2000

[54] SYSTEM AND METHOD FOR ENHANCING MODEM PERFORMANCE USING DIGITAL SIGNAL PROCESSING TECHNIQUES

[75] Inventor: Zhifang Du, San Jose, Calif.

[73] Assignee: PocketScience, Inc., Santa Clara, Calif.

[21] Appl. No.: 09/219,082

[22] Filed: Dec. 22, 1998

Related U.S. Application Data

[63] Continuation-in-part of application No. 09/003,203, Jan. 7, 1998, Pat. No. 6,006,351.
[60] Provisional application No. 60/100,458, Sep. 15, 1998, and provisional application No. 60/102,834, Oct. 2, 1998.

[51] Int. Cl.[7] ............................ H03M 13/00; H04L 1/18
[52] U.S. Cl. ......................... 714/751; 708/303; 708/308
[58] Field of Search .................................. 714/751, 752; 708/300, 303, 308

[56] References Cited

U.S. PATENT DOCUMENTS

| | | | |
|---|---|---|---|
| 5,420,884 | 5/1995 | Inoue | 375/229 |
| 5,592,468 | 1/1997 | Sato | 370/252 |
| 5,790,799 | 8/1998 | Mogul | 395/200.54 |
| 5,884,206 | 3/1999 | Kim | 701/50 |

*Primary Examiner*—Emmanuel L. Moise
*Attorney, Agent, or Firm*—Townsend and Townsend and Crew LLP

[57] ABSTRACT

DSP error detection and filtering of a modem signal using a simple, robust, and low cost technique. The DSP technique utilizes a equalizer/filter to adjust the amplitude and phase delay of the transmitted data signal. The modem on the DSP chip may include a demodulator, parser/interpreter module, start and stop bit module, and modulator. The demodulator may include a switch, equalizer/filter, processing module, bit converter, adder, and averaging module. The averaging module computes an average value for the error signal during the frame training sequence. The error signal is the output of the bit converter minus the output of the demodulator. After each bit of the error signal is fed into the averaging module, the averaging module computes a new average. The averaging module performs an adaptive process. The average value of the error signal is compared to a threshold value. If the average value of the error is greater than the threshold value, the switch is activated by the averaging module and the equalizer/filter processes the data.

23 Claims, 6 Drawing Sheets

SYSTEM AND METHOD FOR ENHANCING MODEM PERFORMANCE USING DIGITAL SIGNAL PROCESSING TECHNIQUES

CROSS-REFERENCES TO RELATED APPLICATIONS

This application claims priority from, and is a continuation-in-part of U.S. patent application No. 09/003,203, entitled "ELECTRONIC COMMUNICATIONS SYSTEM AND METHOD," filed Jan. 7, 1998, now U.S. Pat. No. 6,006,351 the disclosure of which is herein incorporated by reference for all purposes.

This application also claims priority from the following provisional patent applications, the disclosures of which are herein incorporated by reference for all purposes:

1. U.S. Provisional Patent Application No. 60/100,458, entitled "ELECTRONIC MESSAGING SYSTEM," filed Sep. 15, 1998; and 2. U.S. Provisional Patent Application No. 60/102,834, entitled "ELECTRONIC MESSAGING SYSTEM," filed Oct. 2, 1998.

The following applications, including this one, are being filed concurrently, and the disclosure of each other application is incorporated by reference into this application for all purposes:

1. U.S. patent application Ser. No. 09/219,109, (Attorney Docket No. 19185-000100US) entitled "MESSAGING COMMUNICATION PROTOCOL";

2. U.S. patent application Ser. No. 09/219,220, (Attorney Docket No. 19185-000200US) entitled "SYSTEM AND METHOD FOR REMOTELY CONTROLLING MESSAGING SERVER FUNCTIONALITY";

3. U.S. patent application Ser. No. 09/218,973, (Attorney Docket No. 19185-000300US) entitled "SYSTEM AND METHOD FOR COMPRESSION AND DECOMPRESSION OF ELECTRONIC MAIL MESSAGES";

4. U.S. patent application Ser. No. 09/218,911, (Attorney Docket No. 19185-000400US) entitled "SYSTEM AND METHOD FOR COMMUNICATING ELECTRONIC MESSAGES OVER A TELEPHONE NETWORK USING ACOUSTICAL COUPLING"; and 5. U.S. patent application Ser. No. 09/218,932,(Attorney Docket No. 19185-000500US) entitled "SYSTEM AND METHOD FOR PROCESSING ELECTRONIC MAIL MESSAGES."

BACKGROUND OF THE INVENTION

The present invention relates generally to using Digital Signal Processing (hereinafter "DSP") techniques to filter a modem signal and more particularly to recovering a modem signal that has been altered by channel distortion and enhancing the performance of the modem using DSP techniques.

Traditionally, telephone lines have been used to communicate voice signals. Telephone lines have provided a fairly clear and reliable means of communicating voice information. However, each telephone line has its electrical characteristics, and some of them can introduce severe distortion, such as attenuation and phase delay, etc., to the transmitted signal. In voice communication, such as telephone conversations, the human ear can compensate for the distortion to a certain degree.

Recently, telephone lines have been used for data communication (e.g., e-mail messages or Web pages). For data communication over the same telephone line, the modem can not tolerate the same level of distortion as the human ear. Usually, the demodulator in a modem can tolerate a certain level of distortion without making a bit error. The amount of channel distortion that can be tolerated by a modem is mainly determined by the modulation scheme, the error correction code it uses, or the way the signal is encoded.

Error rate is a term used in digital transmission systems to describe the amount of error present during a particular transmission. Voice and data communication can tolerate a certain amount of error or disruption in a transmission and still have the recipient receive an intelligible message. For example, voice communication can tolerate a bit error rate of $10^{-2}$ while data communication can tolerate a bit error rate of $10^{-7}$. Hence, the transmission in data communication needs to be more accurate than voice communication for a recipient to receive an intelligible message. Therefore, data communication needs to be accurately transmitted for the recipient to understand the message or to ensure that the recipient can retrieve the same message that was transmitted.

Frequency Shift Keying (hereinafter "FSK") modulation is a method used for transmitting data across a telephone line. Typically, when using FSK modulation, two different frequencies are transmitted such that when one frequency is transmitted for a certain period of time a logical "0" has been transmitted and when the other frequency is transmitted for a certain period of time a logical "1" has been transmitted. When channel noise or attenuation is present in a signal, different frequencies can be affected differently. Typically, the channel noise and attenuation need to be rectified for voice and data communication to be accurately received.

SUMMARY OF THE INVENTION

The present invention provides DSP error detection and filtering of a modem signal using a simple, robust, and low cost technique. Generally, during a data transmission, a messaging server receives data from a remote device which transmits the data. A DSP module is located on the messaging server to receive the transmitted data. Sometimes the signal transmitted is attenuated due to channel characteristics, e.g., amplitude attenuation and phase delay, between the remote device and messaging server. In addition, the signal can become distorted because there is ambient noise and channel noise on the transmission line. The DSP technique of the present invention utilizes a equalizer/filter to adjust the amplitude and phase delay of the transmitted data signal. The modem on the DSP chip may include a demodulator, parser/interpreter module, start and stop bit module, and modulator. The demodulator may include a switch, equalizer/filter, processing module, bit converter, adder, and averaging module.

In one embodiment, the averaging module computes an average value for the error signal during the frame training sequence. The error signal is the output of the bit converter minus the output of the processing module. After each bit of the error signal is input into the averaging module, the averaging module computes a new average. Hence, the averaging module performs an adaptive or learning process. The average value of the error signal is compared to a threshold value. If the average value of the error signal is greater than the threshold value, the averaging module activates a switch which directs the data to the equalizer/filter.

In another embodiment, data packets are transmitted in a communication system from a transmitter to a receiver. The method of filtering a data packet at the receiver includes providing a reference frame training sequence to the receiver. The reference frame training sequence is used by the demodulator to determine if the frame training sequence received from the transmitter is accurate. The demodulator compares the frame training sequence to the reference frame training sequence to determine if the modem signal is to be filtered.

One advantage of the present invention is to provide a simple, low cost, and robust technique to enhance the signal at the receiver so that the data can be more accurately verified and corrected. Another advantage is to provide a technique to enhance the reliability of the data communication. Still another advantage is to maximize the received signal-to-noise ratio on the messaging server and minimize the bit error rate.

For a further understanding of the nature and advantages of the invention, reference should be made to the following description taken in conjunction with the accompanying drawings.

DESCRIPTION OF THE SPECIFIC EMBODIMENTS

Figure 1:
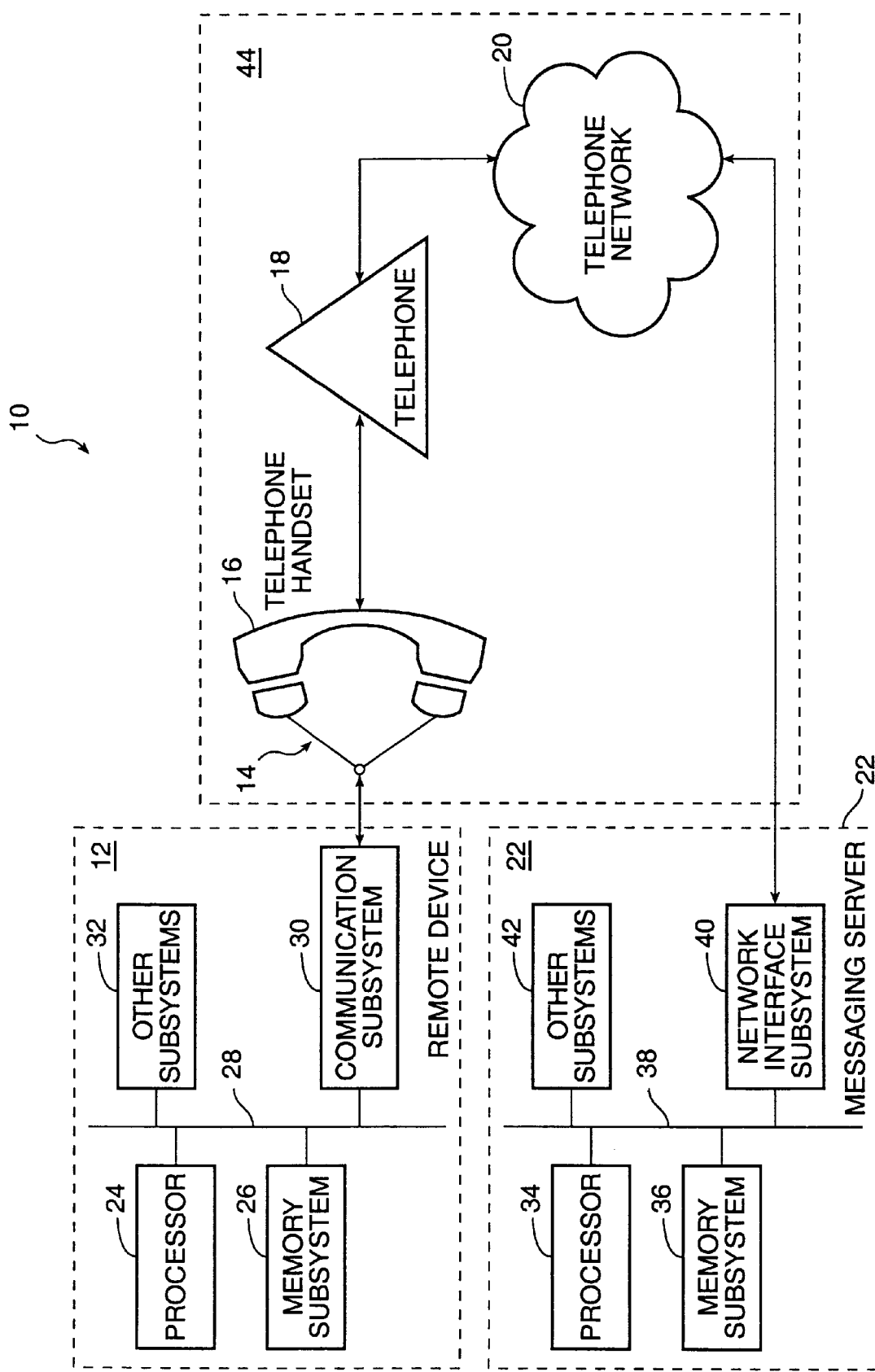
FIG. 1 illustrates a simplified block diagram of a specific embodiment of a messaging system.

FIG. 1 illustrates a simplified block diagram of a specific embodiment of a messaging system. The messaging system 10 may include a remote device 12 coupled to a communication system 44 having an acoustical modem coupler 14, a telephone 18 having a handset 16, a telephone network 20, and a messaging server 22. The telephone network 20 may include land lines (e.g., copper wire, coax, fiber), wireless systems (e.g., satellites, cell phone transceivers), and microwave towers. Examples of the telephone 18 and accompanying telephone handset 16 include a desk unit, traditional rotary unit, public telephone box, and cell phone. Remote device 12 may be a data processing device which generally can operate independent of the messaging server 22. Examples of remote device 12 include desktop computers, personal data assistants, laptops, and other hand-held or portable devices. The remote device 12 may include a processor 24, a memory subsystem 26 having RAM and ROM, bus 28, a communication subsystem 30 and other subsystems 32. The communication subsystem 30 may include an acoustical modem and is connected to the acoustical modem coupler 14. On the remote device 12, the communication protocol software is stored in memory subsystem 26 and may be executed using processor 24, communication subsystem 30, or other subsystems 32.

The messaging server 22 may include a processor 34, a memory subsystem 36 having RAM, ROM and a hard disk, bus 38, network interface subsystem 40, and other subsystems 42. The communication link between the remote device 12 and messaging server 22 is via communication system 44, and more specifically via communication subsystem 30, acoustical modem coupler 14, telephone handset 16, telephone 18, telephone network 20, and network interface subsystem 40. On the messaging server 22, the communication protocol software is stored in the memory subsystem 36 and may be executed using processor 34, network interface subsystem 40, or other subsystems 42. The network interface subsystem 40 is coupled to a processor 34, memory subsystem 36, and other subsystems 42. For further details regarding the messaging system 10, please refer to copending U.S. patent application Ser. Nos. 09/218,973, (Attorney Docket No. 19185-000300) and 09/218,911 (Attorney Docket No. 19185-000400), filed concurrently with the present application and owned by a common assignee.

Figure 2:
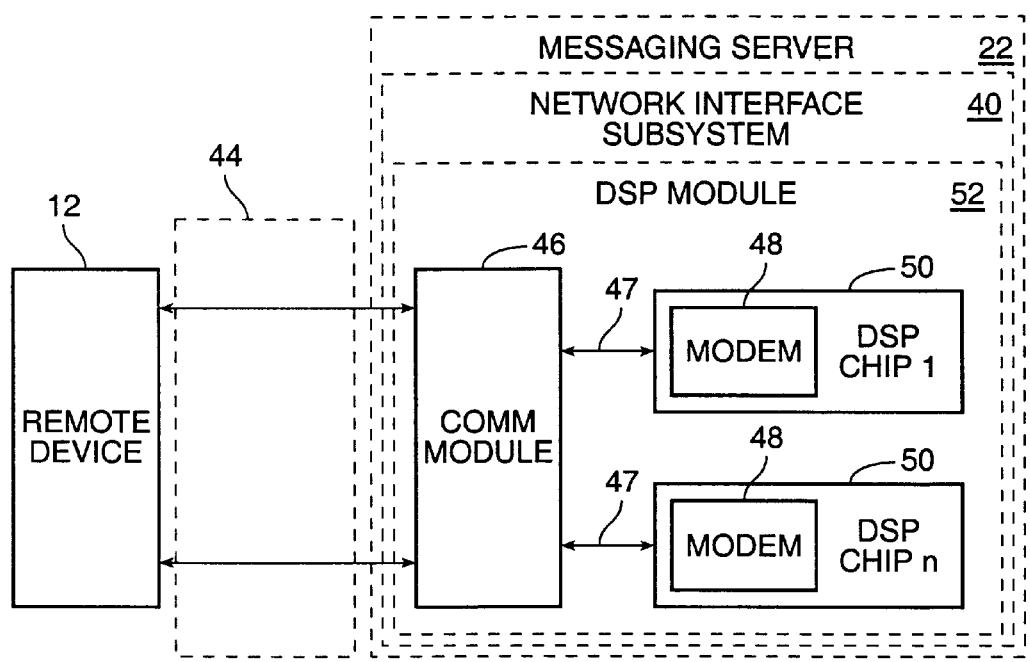
FIG. 2 illustrates a simplified block diagram of a connection between a remote device and a DSP module.

FIG. 2 illustrates a simplified block diagram of a connection between a remote device and a messaging server via a communication system. The messaging server 22 may include a network interface subsystem 40 having a DSP module 52. The DSP module 52 is coupled to communication system 44. The remote device 12 is generally coupled to the DSP module 52 using communication system 44 as described above and shown in FIGS. 1 and 2. The remote device 12 may be called a Subscriber Handheld Unit ("SHU"). Preferably, the communication system 44 has Public Switched Telephone Networks ("PSTN"), preferably T1 lines and its accompanying hardware and software. Each T1 line can input up to 24 analog channels. For further details regarding the communications system 44 between the remote device 12 and the messaging server 22, please refer to copending U.S. patent application Ser. Nos. 09/218,973 (Attorney Docket No. 19185-000300) and 09/218,917 (Attorney Docket No. 19185-000400), filed concurrently with the present application and owned by a common assignee.

In a preferred embodiment, remote device 12 transmits data to and receives data from messaging server 22, and hence the remote device 12 can be described as a full two-way transceiver. Alternatively, the data transfer between the remote device 12 and the messaging server 22 may be half-duplex; either the remote device 12 or the messaging server 22 is transmitting data on the communication system 44 at a given time. Generally, the data transmitted and received are e-mail messages having a size of about 2 k to 5 k bytes.

The communication session begins by a remote user initiating a phone call by manually dialing into the messaging server 22. In a specific embodiment, a toll free number such as a 1-800 number may be used to dial into the messaging server 22. The messaging server 22 answers the in-coming call and may play a voice recording. The voice recording instructs the user to begin data transfer by pressing the <SEND> or <SEND-RCV> or <BLAST> button on the remote device 12. Generally, the remote device user waits until the voice recording ends before the user presses the <SEND> button to send data to the messaging server 22. Alternatively, the remote device user can press the <SEND> button before the voice recording begins. Once communication has been established between the remote device 12 and the messaging server 22, the messaging server 22 stops the voice recording and starts the data communication session. In another embodiment, the remote device 12 detects a tone produced by the messaging server via telephone 18 (see FIG. 1) and begins data transfer thereafter.

Generally, data is transferred across communication system 44, which is the system connecting the remote device 12 to the communication module 46. Typically, the communication module 46 is a T1 module that transmits and receives data. From the communication module 46, data is transmitted to a modem 48 via a data bus 47, such as a MVIP bus. More specifically, the communication module 46 demultiplexes the Time Division Multiplexed (hereinafter "TDM") data into various channels and passes the channel data to a modem 48 on the DSP module 52. Each DSP module 52 can host multiple modems 48 or multiple DSP chips 50. The number of modems 48 that can be hosted in each DSP module 52 is determined by the type of DSP chip 50 chosen in the DSP module 52. Typically, a TI TMS320C32 floating point DSP chip is used.

Figure 3:
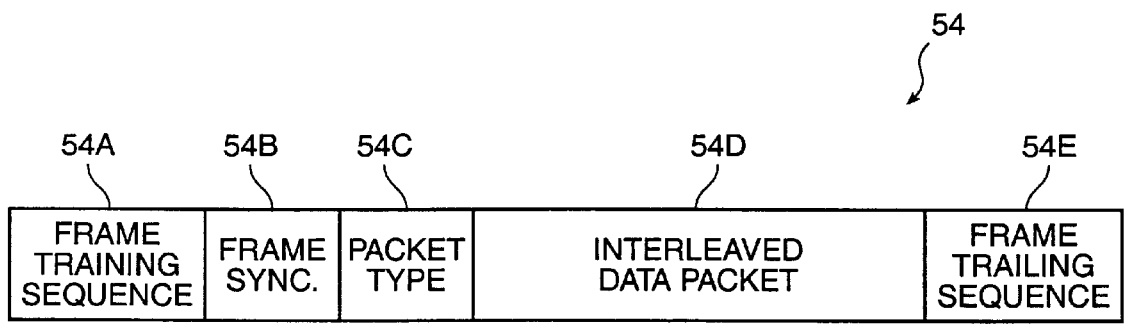
FIG. 3 illustrates a simplified block diagram of a frame which is transmitted from the remote device to the messaging server and which defines a format in which data is communicated between the remote device and the messaging server.

FIG. 3 illustrates a simplified block diagram of a frame which is transmitted from the remote device to the messaging server and which defines a format in which data is communicated between the remote device and the messaging server. Typically, frame 54 is transmitted across communication system 44 using 1200 baud FSK modulation. Frame 54 generally includes digital data represented by an analog signal using two different frequencies. Typically, a frequency of 2,100 Hz represents a logical "0" and a frequency of 1,300 Hz represents a logical "1". Frame 54 may include the following data: a frame training sequence packet 54A, frame synchronization packet 54B, packet type 54C, interleaved data packet 54D, and frame trailing sequence packet 54E. The frame training sequence packet 54A is transmitted to the receiver as the beginning portion of each frame 54. The receiver may be the remote device 12, messaging server 22, or both.

The frame training sequence packet 54A and the frame synchronization packet 54B are generally referred to as the PROLOG packet. The PROLOG packet is used to train the receiver of the data, synchronize the remote device 12 with the messaging server 22, and to determine if the interleaved data packet 54D needs to be equalized/filtered. Typically, the frame training sequence packet 54A and the frame synchronization packet 54B that is transferred from the remote device 12 to the messaging server 22 have known patterns. In one embodiment, the frame training sequence packet 54A may have 116 bits which include 48 bits of "1", 24 pairs of "01", and 24 bits of "1". Typically, the frame training sequence packet 54A and the frame synchronization packet 54B that is transferred from the messaging server 22 to the remote device 12 have known patterns. In one embodiment, the frame training sequence packet 54A may have 48 bits which include 12 pairs of "01" and 24 bits of "1". The frame synchronization packet 54B includes 16 bits of "0" with one start bit and one stop bit at the byte boundary. The frame training sequence packet 54A and the frame synchronization packet 54B do not require the specific number of bits or the specific pattern of bits as described above.

During a data transfer, the PROLOG packet provides information to synchronize the messaging server 22 with the remote device 12 reliably in a short time. The messaging server 22 receives the frame training sequence packet 54A for the training process to begin. The frame training sequence packet 54A and the frame synchronization packet 54B allow the messaging server 22 to lock onto the communication signal transmitted by the remote device 12. The messaging server 22 thereafter receives the packet type 54C, interleaved data packet 54D, and the frame trailing sequence packet 54E. The packet type 54C is used to describe the type of data packet 54D and the frame trailing sequence packet 54E is used so that the receiver can recognize the end of the frame. For further details regarding frame 54, please refer to copending U.S. patent application Ser. Nos. 09/218,973 (Attorney Docket No. 19185-000300) and 09/218,911 (Attorney Docket No. 19185-000400), filed concurrently with the present application and owned by a common assignee.

Figure 4:
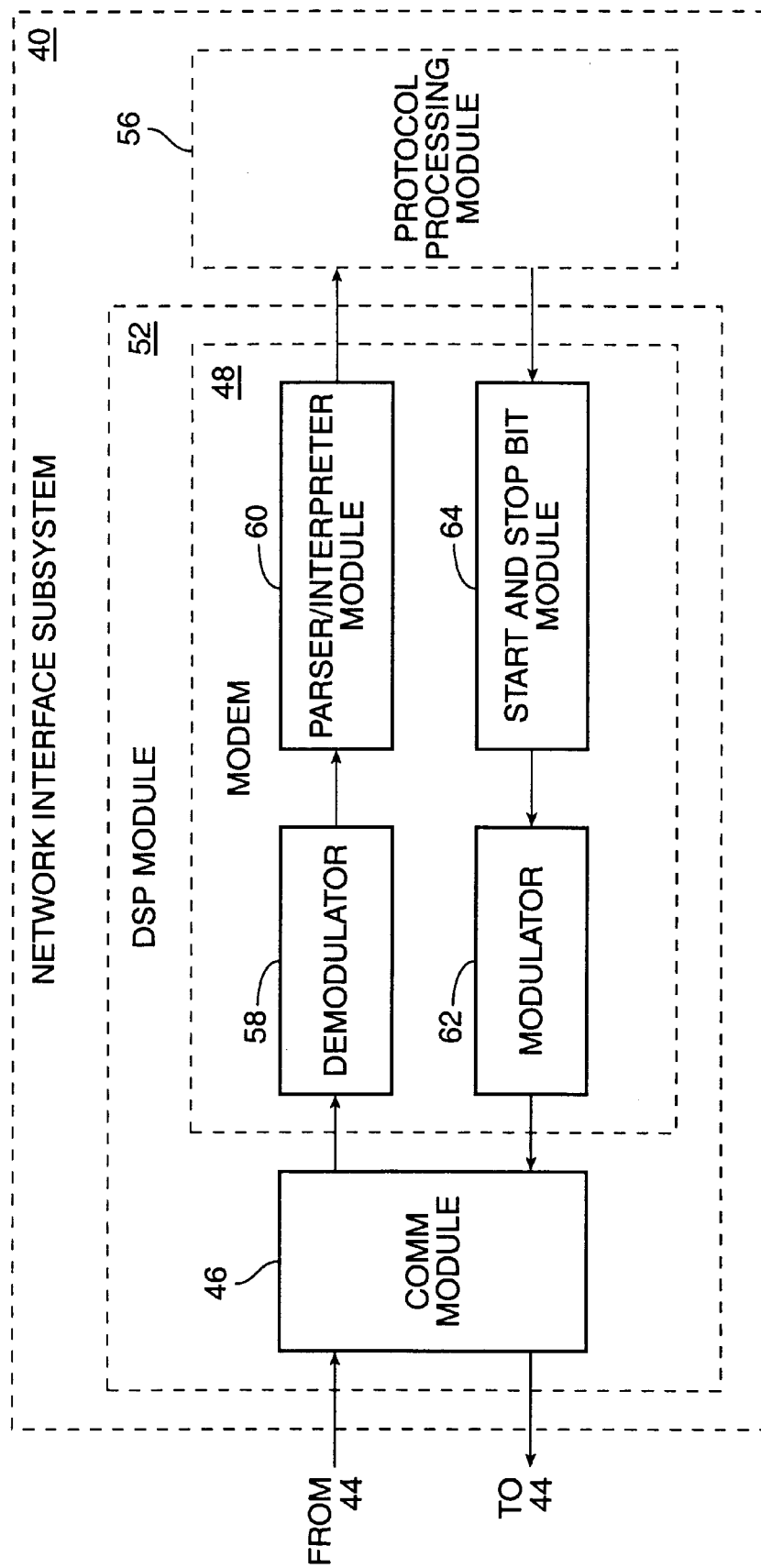
FIG. 4 illustrates a simplified block diagram of the modem.

FIG. 4 illustrates a simplified block diagram of the modem. The modem 48 may include a demodulator 58, a parser/interpreter module 60, a modulator 62, and a start and stop bit module 64. Modem 48 is used to compensate for telephone line distortion or restore a distorted signal in the data communicated between the transmitter and the receiver. Typically, the demodulator 58 receives an analog signal from the communication module 46. The demodulator 58, more specifically, the processing module 70 (see FIG. 5), samples the analog signal received from the remote device 12 at a sampling frequency of approximately 8,000 Hz and converts the analog signal to digital data bits having a format similar to frame 54. The demodulator 58 sends the data bits to a parser/interpreter 60 at a specified data transfer rate such as 1,200 bits per second.

In one embodiment, parser/interpreter 60 parses the data bits into bytes and sends the data bytes to the protocol processing module 56. Upon initialization of the modem 48, the parser/interpreter module 60 retrieves from memory a reference set of data representing the frame training sequence packet 54A. The reference set of data is used as a model to verify the accuracy of the transmitted data. After the frame 54 has passed through the demodulator 58, the parser/interpreter module 60 compares the transmitted data bytes to the reference set of data to determine if the data is accurate. If the received data is not accurate, the parser/interpreter module 60 discards the data and in effect prevents the data from being sent to the protocol processing module 56. If the data is accurate, the parser/interpreter module 60 sends the data to the protocol processing module 56 for processing. The protocol processing module 56 is part of the network interface subsystem 40.

The protocol processing module 56 includes software and/or hardware that perform tasks such as BCH decoding, encoding, interleaving, de-interleaving, and CRC checking. The protocol processing module 56 checks the integrity of the data. If the data is correct, the protocol processing module 56 sends a positive acknowledgment signal (ACK) to the remote device 12. If the data is incorrect, the protocol processing module 56 sends a negative acknowledgment signal (NACK) and waits for the remote device 12 to resend the data, e.g. frame 54. For further details regarding the protocol processing module 56, please refer to copending U.S. patent application Ser. Nos. 09/218,973 (Attorney Docket No. 19185-000300) and 09/218,911 (Attorney Docket No. 19185-000400), filed concurrently with the present application and owned by a common assignee.

Figure 5:
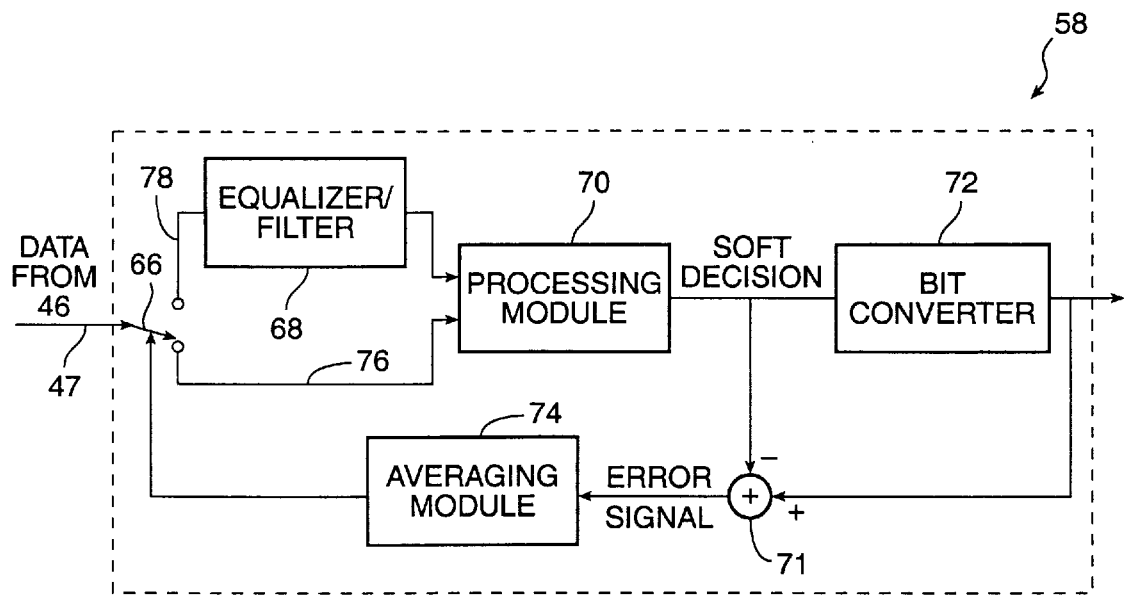
FIG. 5 illustrates further details of the demodulator.

FIG. 5 illustrates further details of the demodulator. Demodulator 58 may include a switch 66, equalizer/filter 68, processing module 70, adder 71, bit converter 72, and averaging module 74. Switch 66, equalizer/filter 68, processing module 70, adder 71, bit converter 72, and averaging module 74 are typically implemented using software code that is stored in ROM or RAM on the DSP chip 50 or hardware on a chip or a combination thereof. Switch 66 is shown as a mechanical switch for simplicity but may be implemented in software or hardware on a chip or a combination thereof.

As described above, demodulator 58 receives the analog signal from communication module 46. The first portion of the analog signal received includes the frame training sequence 54A and the frame synchronization 54B information. The frame training sequence 54A information is used by the demodulator 58 to determine whether to filter the data and if so, what filter coefficients are used during a filtering operation. The filter coefficients are stored in memory located on the DSP module 52. Switch 66 is initially in the filter-off position, as shown in FIG. 5, and the data initially passes to the processing module 70 via unfiltered path 76. The processing module 70 converts the analog signal received from the communication module 46 to approximately a +1 or a −1 value. Typically, since FSK modulation is used, the first frequency is converted to approximately a +1 value and the second frequency is converted to approximately a −1 value.

The output of the processing module 70 is called a "soft decision." The soft decision data is represented by approximately a +1 or −1 value. The soft decision values are input into the bit converter 72 and the adder 71. The bit converter 72 converts the soft decision to a binary number, either a 0 or a 1. Typically, the +1 value is converted to a binary 1 and the −1 value is converted to a binary 0. The output of the bit converter 72 is input into the parser/interpreter 60 (see FIG. 4) and the adder 71. The output of the adder 71, which is called the error signal, equals the output of the bit converter 72 minus the corresponding value of the soft decision. The error signal is input into the averaging module 74.

The error signal is used by the averaging module 74 to determine if the equalizer/filter 68 is to be activated using switch 66. The averaging module 74 determines whether the equalizer/filter 68 is to be activated by comparing the average error signal generated by the averaging module 74 to a threshold value stored in memory. The average error signal is computed during the frame training sequence packet 54A. Hence, the frame training sequence packet 54A is used by the demodulator 58 to determine if channel noise has distorted the analog signal and whether to filter the remaining packets in frame 54 using equalizer/filter 68. Typically, the threshold value is 0.015. The threshold value is stored in memory located on DSP chip 50.

For each error signal data value that is input into the averaging module 74, the averaging module 74 computes a new average for the error signal and compares the new average to the threshold value. If the average error signal is greater than the threshold value, the averaging module 74 activates switch 66 such that the transmitted frame 54 data passes through equalizer/filter 68 via filtered path 78. Therefore, whether the equalizer/filter 68 is activated, is an adaptive process, that is, the new average of the error signal is based on the previous average as well as the new data value produced by adder 71.

Equalizer/filter 68 is applied to partly correct the distortion that may be introduced by the transmission channel. The equalizer/filter 68 coefficients are used to define the filter parameters, such as the amplitude, phase delay, and frequency ranges of the filter, and are stored in memory during setup of the messaging server 22. These coefficients may be altered at other times. To maximize the received signal-to-noise ratio on the messaging server 22 and minimize bit error, the messaging server 22 uses a equalizer/filter 68 to compensate for a wide variety of telephone characteristics. The equalizer/filter 68 is activated based on previous decision errors, and is thus adaptive in nature.

Figure 6:
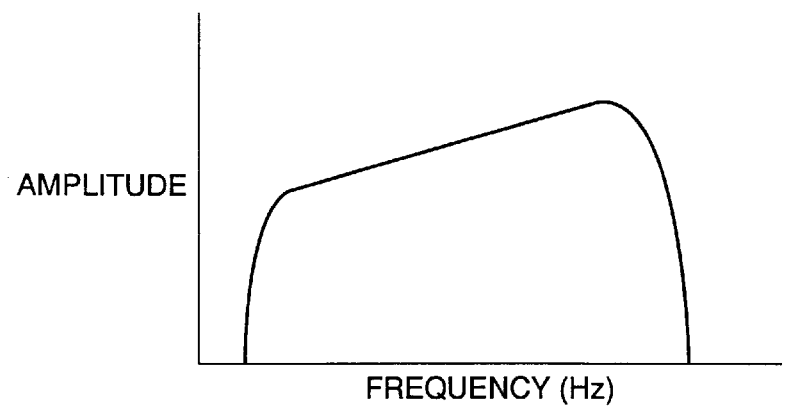
FIG. 6 illustrates an attenuated frequency response caused by a distorted channel.

FIG. 6 illustrates an attenuated frequency response caused by a distorted channel. The attenuated frequency response is shown as having an attenuated amplitude at lower frequencies.

Figure 7:
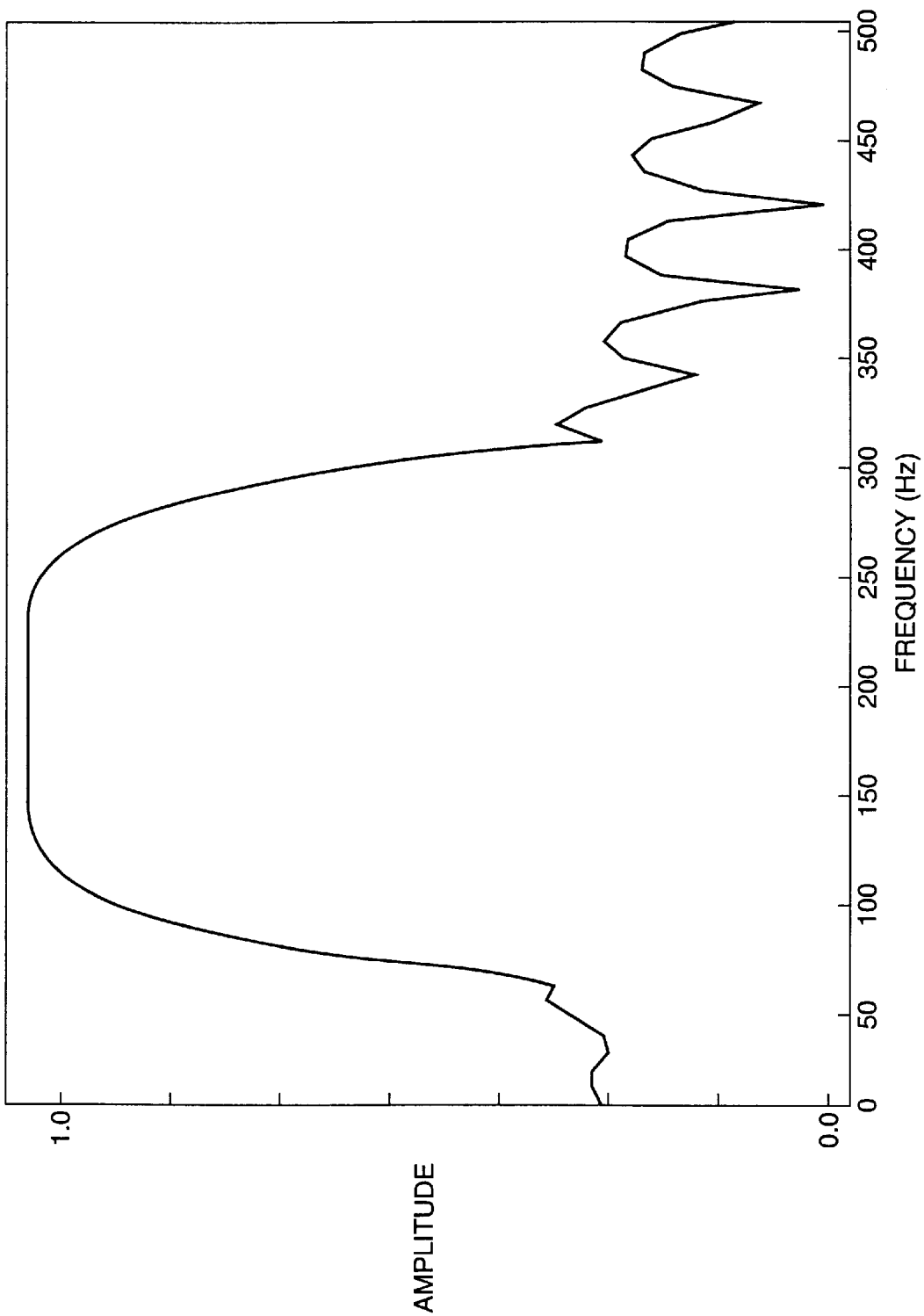
FIG. 7 illustrates a nearly ideal frequency response.

FIG. 7 illustrates a nearly ideal frequency response. The nearly ideal frequency response is shown as having been filtered using distorted channel coefficients.

Figure 8:
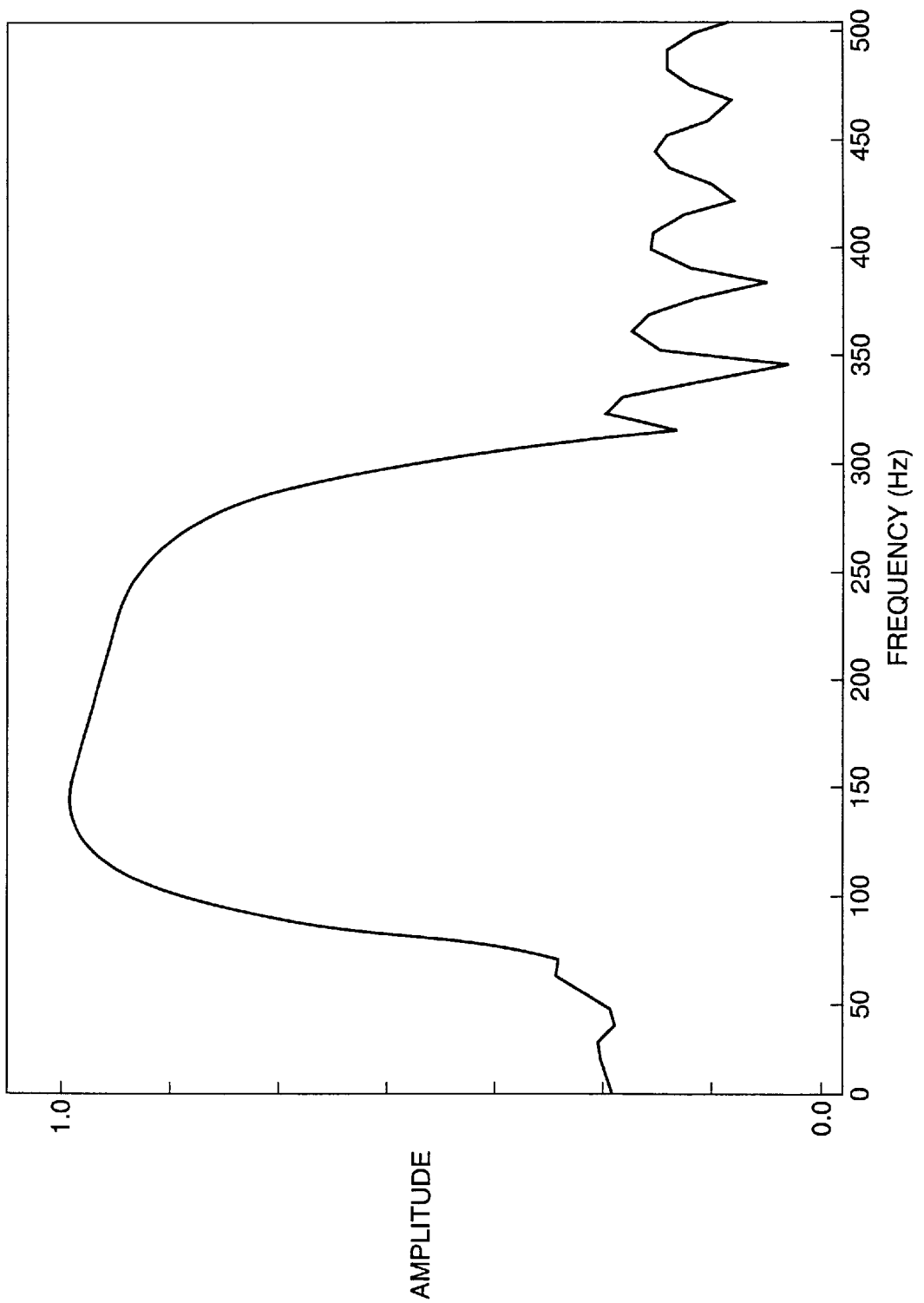
FIG. 8 illustrates the frequency response of a band pass filter used to implement one embodiment of the present invention.

FIG. 8 illustrates the frequency response of a band pass filter used to implement one embodiment of the present invention. Equalizer/filter 68 is used to adjust the amplitude of the data signal so that the protocol processing module 56 can better identify the value of each data bit so that it can correct the data bits and prevent misidentification of the data bits. In one embodiment, equalizer/filter 68, processes the data through a band pass filter having an amplitude of approximately 1.0 and a frequency range from 50 Hz to 300 Hz. Other amplitudes and frequency ranges may also be used. For example, if the analog signal is severely attenuated, the amplitude of the band pass filter may be greater than 1.0. The band pass filter is used to amplify the analog signal at the attenuated frequencies. Alternatively, a low pass filter can be implemented to amplify the analog signal at low frequencies.

The DSP module 52 can also receive e-mail messages from the protocol processing module 56. Generally, an e-mail message is transmitted from the protocol processing module 56 to a start and stop bit module 64. The start and stop bit module 64 adds start and stop bits to the e-mail message and sends the message to the modulator 62. The modulator 62 then transmits the data to the remote device 12.

The invention has now been explained with reference to specific embodiments. Other embodiments will be apparent to one of ordinary skill in the art. For example, the present invention can be implemented using hardware circuitry or software or a combination of hardware circuitry and software. It is therefore not intended that this invention be limited, except as indicated by the appended claims.

What is claimed is:

1. In a communication system having a transmitter and a receiver, a method of determining if a data packet is to be filtered at the receiver, comprising:

transmitting a frame training sequence packet and the data packet from the transmitter to the receiver;

generating an error signal at the receiver based on the frame training sequence packet; and comparing the error signal to a threshold value to determine if the data packet is to be filtered.

2. The method of claim 1 further comprising calculating an average error signal based on the error signal.

3. The method of claim 1 further comprising filtering the data packet if the error signal is greater than the threshold value.

4. The method of claim 1 further comprising selecting a filter coefficient to be applied to the data packet.

5. The method of claim 4 wherein the filter coefficient is selected from a group consisting of an amplitude value, phase delay value, and a frequency range.

6. The method of claim 1 wherein the threshold value is approximately 0.015.

7. The method of claim 1 wherein the data packet includes a plurality of bits.

8. The method of claim 7 further comprising converting each of the plurality of bits into a binary number.

9. A computer system for filtering a data packet, comprising:

a remote device for transmitting a frame training sequence and the data packet to a messaging server, the messaging server having a demodulator, the demodulator used to compare an error signal produced by the messaging server based on the frame training sequence to a threshold value; and an equalizer/filter for altering the data packet if the error signal is greater than the threshold value.

10. The system of claim 9 further comprising an averaging module for calculating an average error signal based on the error signal.

11. The system of claim 9 further comprising means for calculating an average error signal based on the error signal.

12. The system of claim 9 further comprising means for converting the data packet into a binary format.

13. The system of claim 9 wherein the equalizer/filter determines a filter coefficient to use for altering the data packet.

14. In a communication system having a transmitter and a receiver, a method of determining if a data packet is to be filtered at the receiver, comprising:

providing a reference frame training sequence to the receiver;

transmitting a frame training sequence and the data packet from the transmitter to the receiver; and comparing the frame training sequence to the reference frame training sequence to determine if the data packet is to be filtered.

15. The method of claim 14 further comprising filtering the data packet if the frame training sequence is different from the reference frame training sequence.

16. The method of claim 14 further comprising selecting a filter coefficient to be applied to the data packet.

17. A computer program product for filtering a data packet at the receiver, comprising:

code for transmitting a frame training sequence and a data packet from the transmitter to the receiver;

code for providing an error signal to the receiver that is produced by the receiver based on the frame training sequence;

code for comparing the error signal to a threshold value to determine if the data packet is to be filtered; and a computer readable medium for storing the computer codes.

18. The computer program product of claim 17 further comprising code for calculating an average error signal based on the error signal.

19. The computer program product of claim 17 further comprising code for filtering the data packet if the error signal is greater than the threshold value.

20. The computer program product of claim 17 further comprising code for selecting a filter coefficient to be applied to the data packet.

21. In a communication system having a transmitter and a receiver, a method of determining if a data packet is to be filtered at the receiver, comprising:

transmitting a first packet and the data packet from the transmitter to the receiver;

producing an error signal at the receiver based on the first packet;

calculating an average error signal based on the error signal; and comparing the average error signal to a threshold value to determine if the data packet is to be filtered.

22. A computer program product for determining if a data packet is to be filtered at the receiver, comprising:

code for transmitting a frame training sequence and the data packet from the transmitter to the receiver;

code for producing an error signal at the receiver based on the frame training sequence;

code for calculating an average error signal based on the error signal;

code for comparing the average error signal to a threshold value to determine if the data packet is to be filtered; and a computer readable medium for storing the computer codes.

23. A computer system for filtering a data packet, comprising:

a transmitter configured to transmit a frame training sequence and the data packet; and a receiver configured to receive the frame training sequence and the data packet transmitted by the transmitter, the receiver comprising:

an error signal generator configured to generate an error signal based on the frame training sequence;

an averaging module configured to generate an average error signal based on the error signal, the averaging module further configured to compare the average error signal to a threshold value; and a filter module configured to filter the data packet based on the comparison performed by the averaging module.

* * * * *